United States Patent [19]

Wolfe

[11] 4,023,125

[45] May 10, 1977

[54] PRINTED BROADBAND RF BIAS CIRCUITS

[75] Inventor: Allen Robert Wolfe, Sauquoit, N.Y.

[73] Assignee: General Electric Company, Utica, N.Y.

[22] Filed: Oct. 17, 1975

[21] Appl. No.: 622,921

[52] U.S. Cl. .............................. 333/84 M; 333/97 S
[51] Int. Cl.$^2$ ......................................... H01P 5/00
[58] Field of Search .............. 333/7 D, 31 R, 84 M, 333/81 A, 97 R, 97 S

[56] References Cited

UNITED STATES PATENTS

| | | | |
|---|---|---|---|
| 3,246,265 | 4/1966 | Smith-Vaniz | 333/31 R |
| 3,419,813 | 12/1968 | Kamnitsis | 333/84 M X |
| 3,475,700 | 10/1969 | Ertel | 333/7 D |
| 3,665,339 | 5/1972 | Liu | 333/84 M X |

Primary Examiner—Paul L. Gensler

[57] ABSTRACT

A printed broadband rf transmission line circuit is provided with a D.C. bias port in the form of a high impedance printed stub conductor connected between a ground point and the transmission line. Minimum attenuation of a broadband rf signal on the line is achieved by including in the transmission line a plurality of series-connected conductor segments having different line length and impedance values such that the transmission line and stub conductor configuration are tuned to provide a maximum voltage transmission coefficient across the D.C. bias port. The parameters for the series-connected transmission line segments and the stub conductor are selected by performing a computer optimization of the chain matrix equivalent expression of the voltage transmission coefficient for the series-connected transmission line segments together with the stub conductor.

4 Claims, 7 Drawing Figures

PRINTED BROADBAND RF BIAS CIRCUITS

BACKGROUND OF THE INVENTION

In designing printed microwave circuits of the stripline or microstrip variety it is often necessary to couple a D.C. bias potential to a transmission line. Such D.C. coupling is required, for example, for controlling switching diodes included in the rf circuitry. Switching diodes are employed in such rf circuits as step attenuators, switches, limiters, amplifiers and phase shifters.

Heretofore, a satisfactory D.C. bias port has been provided through the use of the conventional high impedance grounded quarter-wavelength stub. The quarter-wavelength stub when connected to the rf transmission line presents essentially infinite impedance to the rf signal and thus provides an ideal circuit path for a D.C. bias signal, the D.C. bias being applied to the stub conductor at the ground point thereon. However, when the rf transmission line to which the quater-wavelength stub is connected has to handle a signal bandwidth exceeding approximately one half octave, substantial rf signal loss is encountered at the D.C. bias port. One way of extending the bandwidth capacity of the quarter-wavelength stub bias circuit has been to fabricate the stub in the form of the so-called "flying lead." A flying lead is a quarter-wavelength stub which is supported above the insulative substrate of the rf circuit such that its characteristic impedance is increased. However, since the characteristic impedance of the lead is still finite, the line length remains a significant factor such that a significant amount of "tweaking" of the elevated conductor element is necessary to obtain satisfactory operation of the circuit over, for example, a two octave bandwidth. As a result of such hand tuning, flying lead circuits are expensive to manufacture and almost impossible to produce with a high degree of repeatability.

Other techniques for securing broadband, high impedance grounded bias ports have been through use of printed lumped inductors and cylindrical inductors which are mounted as discrete components on the rf circuit substrate. These techniques also require high tolerance, expensive manufacturing procedures and thus, from that standpoint, have the same drawbacks as flying lead circuits.

Accordingly, it is an object of the present invention to provide a low cost, easily manufacturable printed rf circuit for coupling a D.C. bias signal to an rf transmission line with minimum attenuation of the rf signal over a bandwidth exceeding to octaves.

Another object is to provide a low cost, broadband printed rf circuit of the type described which is fabricated solely through use of standard microstrip or stripline circuit printing processes.

In accordance with the invention a highly effective printed D.C. bias port is provided for an rf transmission line by connecting a grounded high impedance stub conductor to an area of the rf transmission line which is configured into a plurality of series-connected conduction segments having different line length and impedance values. The line length and impedance parameters of the series-connected transmission line segments and the stub conductor are selected to provide a maximum voltage transmission coefficient across the portion of the transmission line including the series-connected conductor segments.

In accordance with another aspect of the invention there is provided a method for rapidly calculating the optimum line length and impedance parameters for the conductor elements.

These and other objects, features and advantages will be made apparent by the following detailed description of a preferred embodiment of the invention, the description being supplemented by drawings as follows.

DETAILED DESCRIPTION OF EMBODIMENT

Figure 1:
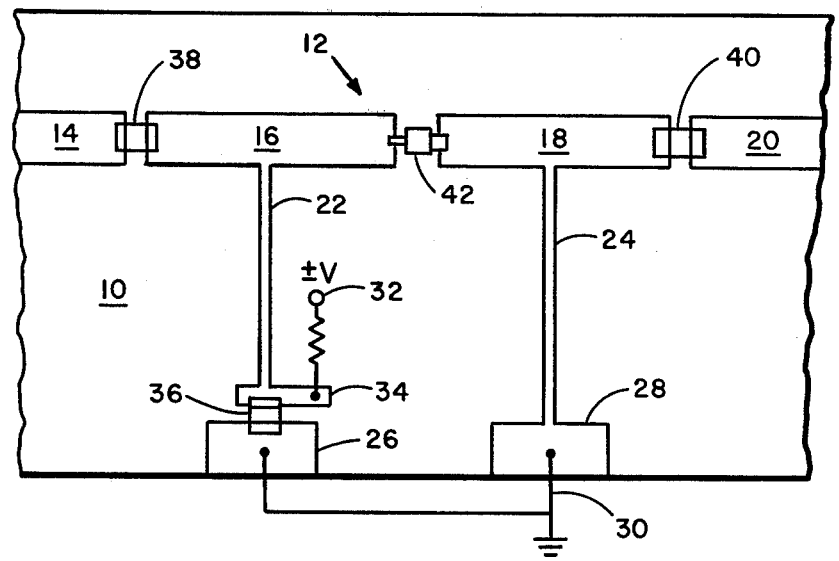
FIG. 1 is a plan view of a narrowband printed rf switching circuit not incorporating the present invention.

Referring to FIG. 1, a conventional rf printed circuit is shown formed on an insulative substrate 10 which may, for example, be in the form of an aluminum oxide chip 25 mils in thickness. The circuit may be constructed for application in the Gigahertz range according to the well known microstrip or stripline fabrication techniques. FIG. 1 shows the circuit magnified several times.

The circuit includes a plurality of printed conductor segments formed on the substrate 10. The back surface of the substrate supports a ground plane conductor. The function provided by the circuit is that of a single pole, single throw switch where an rf signal presented on input conductor 14 is channeled by transmission line 12 through to output conductor 20. A PIN diode 42 is connected in the center of transmission line 12 to provide the switching function.

In order to couple the necessary D.C. control signal to diode 42, a pair of quarter-wavelength high impedance stub conductors 22 and 24 are provided. The stub connectors are connected at one end to segments 16 and 18 of transmission line 12 and are connected at their opposite ends to a D.C. ground point in the rf circuit. Stub 22 is connected to a plated over-edge 26 which is coupled to the ground plane conductor on the opposite side of substrate 10. Similarly, stub 24 is connected to plate over-edge 28.

A source of D.C. bias potential ±V is supplied to a D.C. terminal 32 which is resistively connected to a conductor pad 34 extending from stub conductor 22 at its grounded end. A source of D.C. ground potential is coupled via line 30 to plated over-edges 26 and 28. Capacitive elements 36, 38 and 40 are provided for isolating the D.C. bias signal. These capacitive elements, which may be discrete capacitor components soldered to the printed conductor elements, operate essentially as straight-through conductors for the rf signal but appear as open circuits to the D.C. signal.

In operation, when a D.C. voltage of +V is applied to terminal 32, diode 42 is forward biased and a D.C. conduction path is established through conductor pad 34, stub 22, transmission line segment 16, diode 42, transmission line segment 18 and stub 24 and ground line 30. In this state the rf signal is coupled from input conductor 14 through to output conductor 20 in essentially a straight-through unattenuated manner. Conversely, when −V is applied to D.C. terminal 32, diode 42 is reversed biased and the rf conduction path is blocked so that no signal appears at output conductor 20.

In order that the rf signal can be coupled across D.C. bias ports 22 and 24 without loss, conductors 22 and 24 should ideally appear as open circuits to the rf energy. That is, they should ideally present infinite impedance to the rf signal. In order to achieve as high an impedance as possible, and thus to reduce the rf signal loss to a minimum, conductors 22 and 24 should be configured in accordance with the equation $$Z_{in} = j Z_o \tan \theta \qquad (1)$$

where
  $Z_{IN}$ represents the impedance as seen by the rf signal looking toward ground.
  $Z_O$ is the characteristic impedance of the stub conductor and
  $\theta$ is the electrical length of the stub conductor expressed in degrees (e.g., 90° = λ/4).

It can be seen that in order to maximize the input impedance $Z_{IN}$ either $Z_O$ must be made infinite or the line length must be made a quarter-wavelength (since the tangent of 90° is infinity). Since it would obviously defeat the purpose of the circuit to make a characteristic impedance of stub conductors 22 and 24 infinite, the most that can be achieved through manipulation of the parameter $Z_O$ is to increase $Z_O$ to the maximum value practicable by forming conductors 22 and 24 as narrow as possible within the constrictions of the manufacturing process used for plating the conductor elements. Thus in order to achieve low loss operation of the circuit it is necessary to form the electrical line length of conductors 22 and 24 as near to a quarter-wavelength as possible.

This is easily done through the use of conventional printed circuit fabrication techniques when the application of the circuit requires only single frequency or a narrowband frequency operation. However, when the circuit specification calls for a bandwidth capability exceeding approximately ½ octave the circuit shown in FIG. 1 becomes too lossy for practical use. This is because for signal components lying at the outer limits of the frequency passband, the stub conductors 22 and 24 (assuming that they have been designed to center frequency value) do not operate as quarter-wavelength stubs and the voltage transmission coefficient (T) for the circuit drops off appreciably at the band edges.

Figure 5:
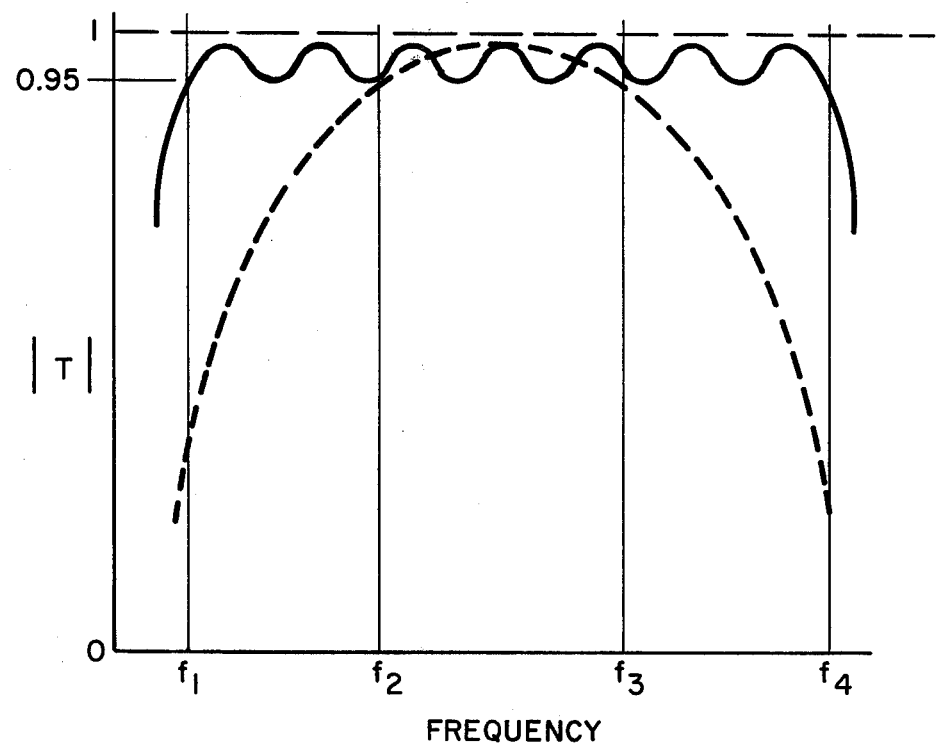
FIG. 5 is a graph showing a plot of frequency response in terms of voltage transmission coefficient for the circuits of FIGS. 1 and 2.

This is illustrated in the graph of FIG. 5 which shows a plot of T with respect to frequency. The horizontal dashed line at the top of the graph represents a voltage transmission coefficient of 1 for all frequencies of interest. This, of course, is the ideal frequency response which in practical applications is unobtainable. The dashed curve on the graph represents the frequency response of the circuit of FIG. 1 and shows that for the narrow frequency band $f_2 - f_3$, T does not drop below 0.95 and therefore the rf signal loss is within acceptable limits. However, for the broad frequency band $f_1 - f_4$ the frequency response for the circuit is unacceptable since T falls off drastically as the band edges are approached.

One way of improving the bandwidth characteristics of the circuit in accordance with previously known techniques is to raise stub conductors 22 and 24 above the surface of substrate 10 to form what are known in the art as "flying leads." This has the effect of lowering the average dielectric constant for the area between the lead and the circuit ground plane whereupon the capacitance of the configuration is also lowered and the characteristic impedance $Z_O$ of the conductor is increased. Referring to equation (1), this has the effect of increasing $Z_O$ such that the need for having a conductor line length precisely matching a quarter-wavelength is reduced. Use of flying leads permits operation of the circuit within acceptable loss limits over a bandwidth of approximately 2 octaves.

As previously mentioned, the drawback associated with flying leads is that since the characteristic impedance of the lead is still finite, line length is of significance in determining the effectiveness of the circuit. It is extremely difficult to control the precise line length during manufacture of the circuit since the flying lead generally takes the form of a wire arch which bridges between connection points on the rf transmission line and ground point. Manual tuning and tweaking of the lead to adjust the effective electrical line length is almost always required as part of the final manufacturing process and this is time consuming and expensive. It is virtually impossible to manufacture flying lead circuits with a high degree of repeatability. Further, other isolation techniques such as wire wound discrete conductors and specially configured lumped inductors, while capable of meeting multi-octave bandwidth requirements, are also undesirable from a cost standpoint.

Figure 2:
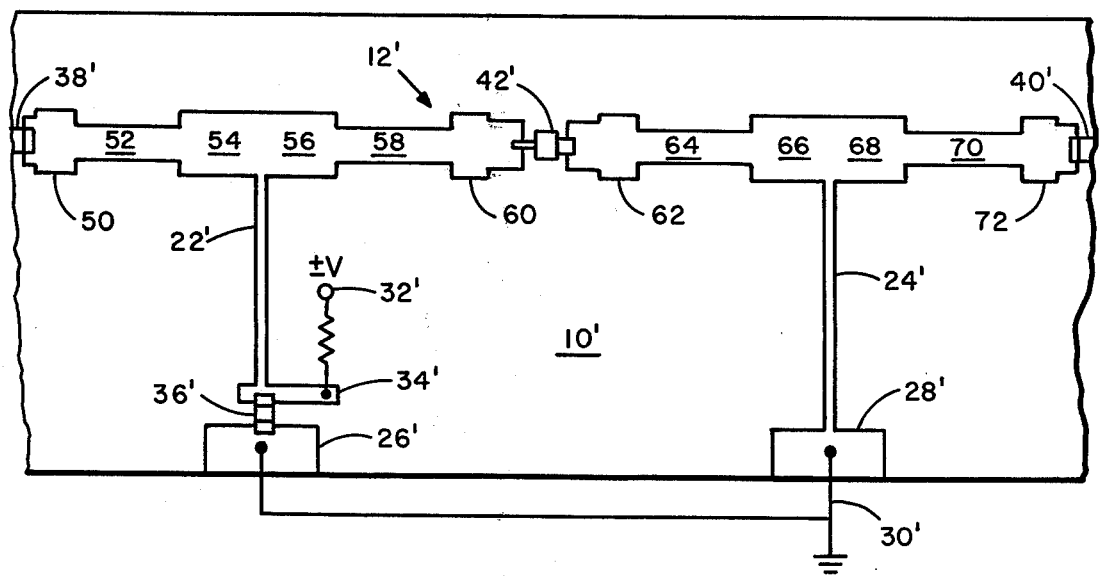
FIG. 2 is a plan view of a broadband printed rf switching circuit constructed in accordance with the principles of the present invention.
Figure 3:
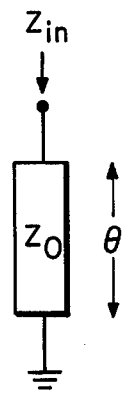
FIG. 3 is a schematic diagram depicting a grounded stub circuit having a characteristic impedance of $Z_0$ and a line length of $\theta$.

Referring to FIG. 2, a printed rf switching circuit performing a function similar to that described above for the circuit of FIG. 1 is shown constructed in accordance with the principles of the present invention. The circuit shown in FIG. 2 can be easily manufactured with conventional, low cost stripline or microstrip fabrication techniques and is capable of providing low loss operation over an rf frequency band as broad as 2½ octaves. The circuit employs a pair of stub conductors 22' and 24' which in general appearance are similar to the stub conductors 22 and 24 previously described for the circuit of FIG. 1. The circuit elements of FIG. 2 identified with primed referenced numerals correspond to like-numbered elements of FIG. 1.

Broadband D.C. bias coupling is provided in accordance with the invention by fabricating the rf transmission line in the form of a plurality of series-connected conductor segments oriented in a pattern of varying line length and impedance parameter values which is symmetrical about the point of intersection between the transmission line and the stub conductor. As can be seen by comparing FIG. 2 with FIG. 1, the difference in the circuits is that the transmission line segments 16 and 18 (FIG. 1) have been replaced by a pair of transmission line sections constructed from a plurality of series-connected conductor segments 50, 52, 54, 56, 58, 60 and 62, 64, 66, 68, 70, 72 (FIG. 2), respectively.

In addition, although not apparent in the drawings, the electrical lengths of stub conductors 22' and 24' are different from the electrical lengths of stub conductors 22 and 24 by some amount determined by the band of frequencies over which the circuit of FIG. 2 is designed to operate.

Except for bandwidth differences, the operation of the circuit of FIG. 2 is the same as that described for the circuit of FIG. 1. That is, when a D.C. bias signal of +V is applied to terminal 32', diode 42' is forward biased and the rf input signal coupled to capacitor 38' is transmitted subtantially without loss through to capacitor 40' which couples the signal to the output conductor. On the other hand, when a D.C. bias voltage of −V is applied to terminal 32', diode 42' is reversed biased and no output is generated.

The line length and impedance values for the transmission line segments 50, 52, 54, 56, 58, 60 and stub conductor 22' are selected to give a maximum voltage transmission coefficient over the frequency band of interest. The same parameter selection criteria are used in designing segments 62, 64, 66, 68, 70, 72 and conductor 24'.

While it is noted that the grounded stub 22' as shown in FIG. 2 has six transmission line segments associated with it, i.e., 50, 52, 54, 56, 58 and 60, there is no set number of segments required in accordance with the principles of the invention. Generally, the more segments that are used, the wider the bandwidth response will be. In designing the circuit elements to suit a particular application, it is first necessary to determine the amount of substrate space which is available. This is because if extremely broadband characteristics are desired, the maximum number of transmission line segments which can be fitted into the space available should be used. An initial estimate of the number of segments can be made by assuming for each segment a length of ⅛ of the wavelength of the center frequency in the frequency band of interest.

The specific circuit parameters are calculated using an "exhaustive search" procedure based on computing voltage transmission coefficient values as a function of frequency for various assumed line length and impedance parameters and comparing the results until an optimum set of parameters is determined.

The equation for voltage transmission coefficient is $$|T| = \frac{2}{A_E + B_E + C_E + D_E} \quad (2)$$

where $A_E$, $B_E$, $C_E$ and $D_E$ are the matrix products of $$\begin{vmatrix} A & B \\ C & D \end{vmatrix}$$

for all transmission line segments plus the stub conductor taken in the order 50, 52, 54, 22,' 56, 58, 60. In the matrix $$\begin{vmatrix} A & B \\ C & D \end{vmatrix}$$

the values of A, B, C and D for each conductor segment are as follows:

$$A = \cosh \gamma L \qquad C = \frac{1}{Z_o} \sinh \gamma L$$

$$B = Z_o \sinh \gamma L \qquad D = \cosh \gamma L$$

where
$\gamma$ = propagation constant $\alpha + j\beta$ per unit length of the segment
$L$ = segment length in mils
$Z_o$ = characteristic impedance of the segment The above method of determining T is known as the "chain matrix" analysis technique and is described in the literature. For example, see the text *Microwave Filters, Impedance Matching Networks And Coupling Structures* by G. Mathaei, L. Young and E. M. T. Jones, McGraw-Hill, 1964, pages 26–28.

Using equation (2) a first frequency response curve for the network is calculated by plugging in an initial set of assumed parameters and calculating T for each of a number of frequency points spread across the band of interest. The number of frequency points selected depends upon the number of peaks and valleys expected to exist in the response curve for the particular frequency band. For example, twenty equally spaced sampling points have been found to be adequate for the band from 2–8 GHz.

After a frequency response has been calculated with the initial set of assumed parameters, the parameters are thereafter varied in a systematic fashion, described below, and the results compared. After an optimum set of parameters has been ascertained using the first set of assumed values for Z (impedance) and $\theta$ (line length), a second set of assumed impedance and line length parameters is selected based on the results of the first calculations and the process is repeated. After completion of several iterations of the above computation, comparison and selection steps, the final calculated parameters are known to represent essentially the optimum parameters for the frequency band of interest.

Figure 4:
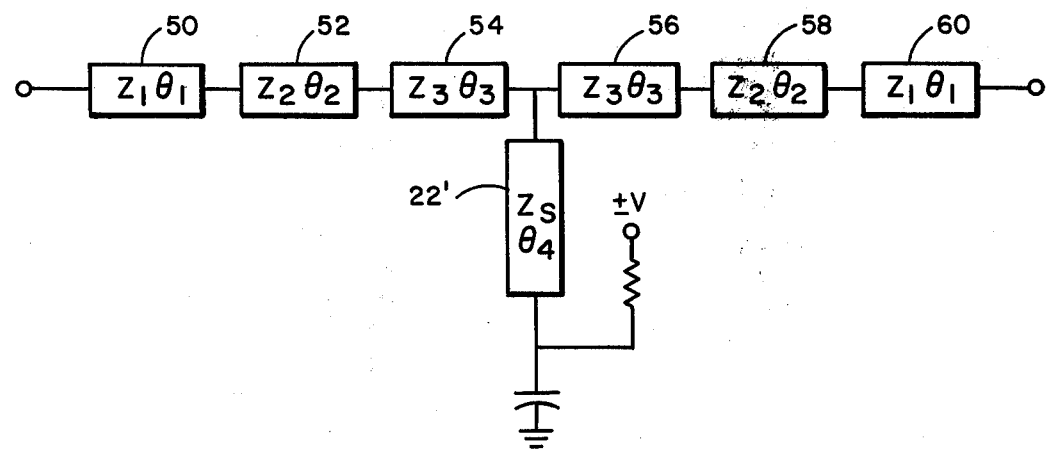
FIG. 4 is a schematic diagram illustrating a portion of the rf circuit shown in FIG. 2.

Referring to FIG. 4, a description will be given of an example of the specific procedures which may be employed for computation of the optimum parameter values for the seven segment circuit configuration shown in FIG. 2 comprising transmission line segments 50, 52, 54, 56, 58 and 60 together with the stub conductor 22'. Each of the conductor segments 50, 52, 54 and 22' are considered as separate and independent elements having impedance and line length values of $Z_1$, $\theta_1$, $Z_2$, $\theta_2$, $Z_3$, $\theta_3$, $Z^5$ and $\theta_4$ respectively. Since it is known that the arrangement of transmission line segments will be symmetrical about the point where stub conductor 22' intersects with the line, transmission line segments 56, 58 and 60 are provided with the same impedance and line length values as the segments 54, 52 and 50, respectively. Also, since it is known that the stub conductor must have the maximum characteristic impedance possible within the constraints of the circuit fabrication process, the characteristic impedance of conductor 22' is set at the fixed maximum value $Z_S$ and is not varied during the optimization process.

To begin the process three values are selected for each of the parameters which are to be varied, i.e., $Z_1$, $\theta_1$, $Z_2$, $\theta_2$, $Z_3$, $\theta_3$ and $\theta_4$. For example, the three impedance values may be set at a center value, an upper value and a lower value where the center value is set at a normalized value of 1, i.e., equal to the system characteristic impedance. The upper and lower impedance values may be set at ± 0.4 of the center value. The three initial values of $\theta$ may be set, for example, at center, upper and lower values equal, respectively, to 45° ($\lambda/8$) of the center frequency of the band of interest, 77° of the center frequency and 13° of the center frequency, respectively. In other words, the initial three values selected for the line length parameter $\theta$ are equal to 45° ± 32° of center frequency of the band of interest.

Using equation (2), the center values for each of the selected parameters $Z_1$, $\theta_1$, $Z_2$, $\theta_2$, $Z_3$, $\theta_3$ and $\theta_4$ are substituted into the equation and a voltage transmission coefficient value is computed for each frequency sampling point selected across the frequency band. Next, the low value for $Z_1$ is substituted into the equation (while all other parameters are left the same as for the previous computation) and a second frequency response is computed. The T values obtained from the second computation are compared to those from the first computation and the set with the highest (i.e., closest to unity) worst-case value of T ($T_{min}$) is retained along with the $T_{min}$ value. Next a third computation is run using the higher $Z_1$ parameter while the other parameters remain the same as before. Again, a comparison is made against the retained $T_{min}$ value resultant from the previous computation and the set of parameters yielding the highest value of $T_{min}$ is retained along with the associated $T_{min}$ value.

This process is repeated until every possible combination of the three initially assumed values of $Z_1$, $\theta_1$, $Z_2$, $\theta_2$, $Z_3$, $\theta_3$ and $\theta_4$ have been substituted into the equation and processed. In the example shown in FIG. 4, the total number of computations required will be $3^7$ since there are seven parameters to be varied and each parameter has three possible values.

At the end of this computation-comparison sequence one set of parameters will be retained as yielding the highest value of $T_{min}$. Next, using those parameter values as the new center values, a second group of three assumed values is chosen for each of the seven variable parameters. The upper and lower values for this second set of assumed parameters may, as in the case of the first set of assumed parameters, be varied ± 32° for line length and ± 0.4 for impedance. Using this second set of assumed parameters, the same process is repeated whereby T is calculated across the frequency band until the set of parameters yielding the highest value of $T_{min}$ is identified. If no set of parameters yields a higher $T_{min}$ than that produced during the previous set of computations, the set of computations is run using the same center value parameters and selecting upper and lower values using a narrower deviation. That is, the upper and lower values for $\theta$ can be set at ± 16° from the center value and for Z the upper and lower values can be set at ± 0.2 from the center value. Using these parameters another set of $3^7$ T computations are run and the set of parameters yielding the highest value of $T_{min}$ is retained.

The above described process of selecting line length and impedance parameters and calculating for optimum T vs. frequency response can be repeated as many times as desired. However, one practical limitation on the number of computations that can be run is that after several steps of selecting narrower upper and lower parameter limits a point will be reached where the values of the parameters will exceed the tolerance limits of the manufacturing process using for fabricating the conductor segments on the substrate. It is of no practical value, of course, to refine the parameters beyond that point. A second limitation on the number of computations that can be made is, of course, the extent of the computation facilities and time available to the designer.

Figure 7:
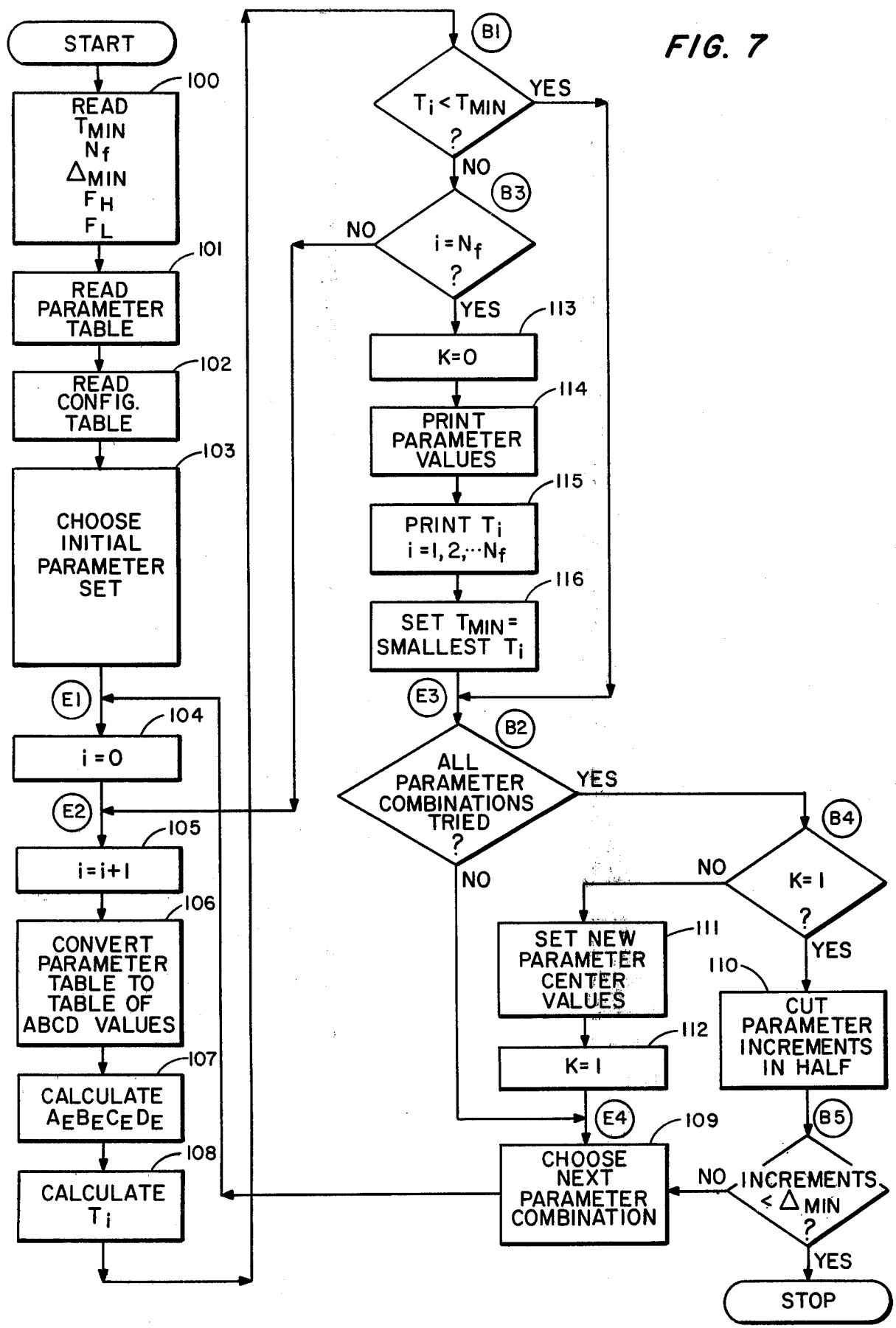
FIG. 7 is a flow diagram illustrating one form of computer program that may be used for controlling the selection of optimum conductor line length and impedance parameters for the networks shown in FIG. 2.

Naturally, to do the kind of exhaustive search analysis described above, a computer is required for running the computations of the parameter values and for comparing and retaining the results. An example of a novel computer program that has been successfully employed is illustrated in FIG. 7 which shows a simplified flow chart for a program that was compiled with FORTRAN and run on a Honeywell 6080 computer. In the diagram, rectangular blocks represent computer operations, and diamond-shaped blocks represent decision branch-points (labelled with a B prefix). Entry points are labelled with an E prefix.

The first series of operations 100, 101 and 102 consists of reading the required initial data into the computer. $T_{min}$ is some value of T set low enough (e.g., zero) to insure that all calculated T values for the initial set of chosen parameters will exceed it. $N_f$ is the number of frequency sample points in the frequency band of interest for which T values will be calculated and $\Delta_{min}$ is the smallest parameter value increment of interest for each parameter to be optimized (i.e., line length $\theta$ and impedance Z). $F_H$ and $F_L$ are, respectively, the high and low frequencies in the frequency band of interest.

The "parameter table" is a collection of input data setting forth the initial conductor center parameters and the initial $\alpha$increments to be used to derive the associated upper and lower parameter values. The parameter table further includes data to identify the type of circuit elements in the network and a code designation for each parameter indicating whether or not the parameter is to be varied or held constant during the optimization process. The "configuration table" (operation 102) is a data sequence indicating the order in which the circuit elements are to be considered in the matrix multiplication computation (operation 107) used for determination of $A_E$, $B_E$, $C_E$ and $D_E$.

It is to be understood that the computer already has in storage the necessary subroutines for computing the ABCD matrix products for the different circuit elements and for computing T (equation 2 above).

After the read-in operations are completed, the computer selects an initial set of parameters for all the circuit elements (FIG. 7, operation 103). While no particular set of initial parameters is required, one convenient set consists of the center values specified in the parameter table. The program then proceeds through entry point E1 to operation 104 where the control variable $i$ is set to zero. Control variable i is used to provide a specific value of $\lambda$(wavelength). In operation 105 $i$ is incremented to 1, which indicates the first frequency sample point in the frequency band. Thereafter, the program calls out the appropriate subroutines for calculation of the ABCD matrix values for each circuit element (operation 106). Next, in operation 107, the matrix multiplication subroutine is exercised, resulting in calculation of the $A_E$, $B_E$, $C_E$ and $D_E$ values.

Operation 108 is then performed whereupon a value for $T_i$ is computed using equation (2). Since the control variable $i$ is set at 1 the calculated T value will be for the first frequency sample point in the frequency band.

Next, at branch point B1 $T_i$ is compared with $T_{min}$ and if $T_i$ is larger (which it must be for the first program cycle) branch point B3 is encountered. If $i$ does not equal $N_f$ the program goes back to entry point E2 where operations 105, 106, 107 and 108 are again performed, resulting in computation of T for the next frequency sample point in the band. Again, branch points B1 and B3 are traversed in the "NO" direction and the $T_i$ calculation loop will again repeat. This continues until all values of T are computed for $i=1$ through $i=N_f$.

After this, branch point B3 is traversed in the "YES" direction and operations 113, 114, 115 and 116 are performed. This results in the setting of the control flag bit K to zero (operation 113) and the printing out of the present $\theta$ and Z parameters and all the computed $T_i$ values. After that, $T_{min}$ is reset to be equal to the smallest value of $T_i$ just calculated (operation 116).

The program then proceeds through branch point B2 in the NO direction and performs operation 109 whereupon one of the parameter values for one of the circuit elements is changed to set up a new combination of parameters. The program then moves to entry point E1 whereupon a new $T_i$ computation cycle is begun. The process of setting up new parameter combinations in operation 109 may be controlled, for example, through use of a "nested DO loop" routine which sequentially runs through the $3^7$ different parameter combinations for each parameter set.

During the next $T_i$ computation cycle, as well as in all succeeding $T_i$ computation cycles, branch point B1 acts to automatically "throw out" any parameter combination which yields a $T_i$ value lower than $T_{min}$. That is, B1 is traversed in the YES direction if $T_i$ is less than $T_{min}$ whereupon the program proceeds directly to branch point B2 and thence to operation 109 where a new parameter combination is chosen and a new $T_i$ computation cycle is begun. However, for any parameter combination which produces $T_i$ values which are all greater than $T_{min}$, the $T_i$ computation cycle will be completed through to $N_f$ and thereafter the program will proceed through branch point B3 to operations 113, 114, 115 and 116. The result is that the last parameter combination to be printed out is always the best parameter combination encountered up to that point.

When all combinations of a given set of parameters have been tried, branch point B2 is traversed in the YES direction and the program will either set up a new set of parameter center values (operation 111) or set up a narrower set of upper and lower parameter selection increments (operation 110), depending on the value of flag bit K. K is initially set at 0 in operation 113. After the initial set of parameters is exhausted, branch point B4 is traversed in the NO direction so that operation 111 is selected. This sets up a new set of parameter center values equal to those values stored in the print readout registers (re operation 114). As previously mentioned, those stored parameter values, being the last ones printed out during the preceding $T_i$ computation cycle, are the best parameter values discovered to that point.

Thus, the next series of $T_i$ computation cycles will be carried out using the best previously discovered set of parameters as the new center values and using the same upper and lower parameter selection increments as before (i.e., $\pm 32°$ for $\theta$ and $\pm 0.4$ for Z). Flag bit K is set to 1 in operation 112 following selection of the new parameter values.

However, if the program runs through an entire parameter set ($3^7$ $T_i$ computation cycles) without ever traversing branch point B1 in the NO direction, branch point B4 will be traversed in the YES direction. This selects operation 110 such that the previous parameter center values are retained but the parameter increments are cut in half so that the upper and lower parameter values are drawn in closer to their associated center values.

After that, branch point B5 is traversed in the "NO" direction and the ensuing $T_i$ computation cycles will result in a finer resolution of the parameter selection process due to the use of the narrower parameter upper and lower selection increments. After the program has run through operation 110 several times, the parameter values will have been "honed" to the point where an additional halving of the upper and lower selection increments will result in parameter values which cannot be achieved in the manufacturing process used for plating the conductor segments. When this occurs the $\Delta_{min}$ limit is exceeded and branch point B5 will be traversed in the YES direction. This terminates the program.

The parameter values last printed out in operation 114 are the optimum parameters for the frequency band specified.

In the above program, a substantial computer time savings can be realized if the $T_i$ computation cycles are processed by running through the most "suspect" frequency sample points first. That is, the circuit designer should be able to predict which frequency points are likely to exhibit degraded performance. This most often is true of frequency points near the band edges. If these points are calculated at the beginning the $T_i$ computation cycle for each parameter combination, rejection of unsatisfactory parameter combinations at branch point B1 will take place sooner so that aggregate computer time is reduced.

Referring to FIG. 5, a typical T vs. frequency response curve for a set of optimum parameter values is shown by the solid curve. It is noted that the minimum T value across the broad frequency band $f_1 - f_4$ is 0.95 and is within acceptable limits.

The above description of the computation procedures and computer program steps required for obtaining an optimum set of circuit parameters is not necessarily the only computation method or program that can be used. It is, however, considered by the inventor as the preferred procedure as of the time of filing the present application. For example, instead of comparing the computation results on a worst-case basis, the sum of all T values could be used. That is, since it is known that the best frequency response is a voltage transmission coefficient of 1 for all frequency points across the band, the comparison routine could simply select the set of parameters which yielded the maximum sum of T values. However, this procedure does not necessarily guarantee that all of the "valleys" (see FIG. 5) running across the T vs. frequency response curve will be within a given limit. For example, the set of parameters yielding the maximum sum of T values might include several very small ripples in the curve and one or two large valleys extending below the acceptable T limit. However, the "worst-case" comparison technique described hereinabove eliminates this possibility and assures circuit performance within a predetermined set of limits.

One example of an optimum set of line length and impedance values for a seven-segment circuit configuration of the type shown at the input and output of the switching circuit of FIG. 2 is as follows:

|  | θ | Z |
|---|---|---|
| stub conductor 22' | 70° | 64 ohms |
| segments 54, 56Z | 52° | 31 ohms |
| segments 52, 58 | 37° | 45 ohms |
| segments 50, 60 | 13° | 29 ohms |

The above values give optimum response over the 2–8 GHz. frequency band. Line length $\theta$ is given in terms of degrees of the center frequency 5 GHz. (e.g., $90° = \lambda/4$). The same values may also be used for the output circuit comprising stub 24' and segments 62, 64, 66, 68, 70 and 72.

Figure 6:
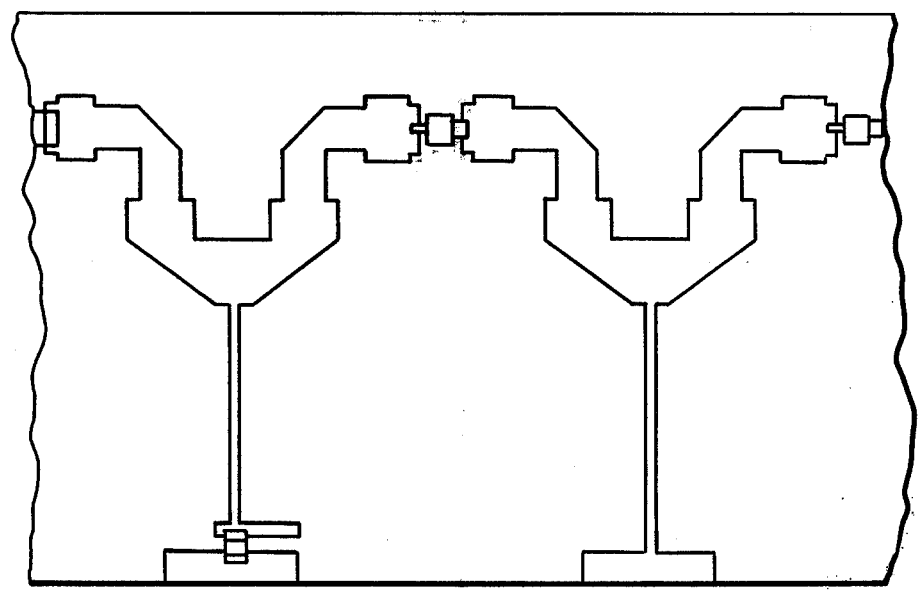
FIG. 6 is a plan view of a printed rf circuit equivalent to that shown in FIG. 2 but having the transmission line portion thereof folded for the purpose of shortening the overall circuit configuration.

FIG. 2 shows that a broadband circuit constructed in accordance with the present invention tends to be greater in length than the corresponding narrowband circuit (FIG. 1) because of the requirement for multiple transmission line segments. However, the transmission line segments can be folded in accordance with well known design techniques so that the overall circuit length can be reduced. An example of a circuit shortened by this technique is illustrated in FIG. 6.

It will be appreciated that various changes in the form and details of the above described preferred embodiment may be effected by persons of ordinary skill without departing from the true spirit and scope of the invention.

I claim:

1. A printed rf circuit for providing a D.C. bias path to an rf transmission line with minimum attenuation of a broadband rf signal on said line, comprising, in combination:

a high impedance printed stub conductor connected to a ground point in said rf circuit;

a plurality of printed signal conductors connected in series with each other and in series with said rf transmission line, with one of said signal conductors being connected to said stub conductor at the end of said stub opposite said ground point and forming a network of rf conductors, said printed signal conductors in the branch circuit between said stub conductor and said rf transmission line having different line length and impedance values, said line length and impedance values being selected to provide substantially the maximum voltage transmission coefficient across said signal conductors over the frequency range of said broadband signal; and means for coupling a D.C. bias potential to said ground point.

2. The rf circuit set forth in claim 1 wherein said plurality of printed signal conductors are configured such that said different line length and impedance values are arranged according to a pattern which is electrically symmetrical about the point of intersection between said stub conductor and said signal conductors.

3. A printed rf circuit for providing a D.C. bias path to an rf transmission line with minimum attenuation of a broadband rf signal on said line, comprising, in combination:

a high impedance printed stub conductor connected through a capacitive element to a ground point in said rf circuit;

a plurality of printed signal conductors connected in series with said rf transmission line, with one of said signal conductors being connected to said stub conductor at the end of said stub opposite said ground point and forming a network of rf conductors, said printed signal conductors in the branch circuit between said stub conductor and said rf transmission line having different line length and impedance values, said line length and impedance values being selected to provide substantially the maximum voltage transmission coefficient across said signal conductors over the frequency range of said broadband signal; and means for coupling a D.C. bias potential to said stub conductor substantially at the point where said conductor is connected to said capacitive element.

4. The rf circuit set forth in claim 3 wherein said plurality of printed signal conductors are configured such that said different line length and impedance values are arranged according to a pattern which is electrically symmetrical about the point of intersection between said stub conductor and said signal conductors.

* * * * *